United States Patent [19]

Redman

[11] 4,327,962
[45] May 4, 1982

[54] LASER/AMPLIFIER/DETECTOR DIODE

[76] Inventor: Charles M. Redman, 4500 Panorama Dr., Las Cruces, N. Mex. 88001

[21] Appl. No.: 121,182

[22] Filed: Feb. 13, 1980

[51] Int. Cl.³ .............................................. G02B 5/174
[52] U.S. Cl. ................................ 350/96.15; 350/96.12; 350/358; 356/350; 357/19
[58] Field of Search ............... 350/96.12, 96.13, 96.14, 350/96.15, 96.17, 358; 356/349, 350; 357/16, 17, 18, 19, 30

[56] References Cited

U.S. PATENT DOCUMENTS

| | | | |
|---|---|---|---|
| 3,902,133 | 8/1975 | Watts | 350/96.12 X |
| 4,039,260 | 8/1977 | Redman | 356/350 |
| 4,054,363 | 10/1977 | Suematsu | 350/96.17 X |
| 4,065,729 | 12/1977 | Gover et al. | 357/19 X |
| 4,118,676 | 10/1978 | Redman | 332/7.51 |
| 4,122,407 | 10/1978 | Van Vechten | 357/16 X |
| 4,133,612 | 1/1979 | Redman | 356/350 |
| 4,138,196 | 2/1979 | Redman | 356/350 |
| 4,217,598 | 8/1980 | d'Auria et al. | 357/19 |
| 4,218,692 | 8/1980 | de Cremoux | 357/19 |

OTHER PUBLICATIONS

Nakamura et al., "Laser Oscillation in Epitaxial GaAs Waveguides ...," *Appl. Phys. Lett.*, vol. 23, No. 5, Sep. 1973, pp. 224–225.

Wang, "Design Considerations of the DBR Injection Laser and ...," *IEEE J. Q. E.*, vol. QE-13, No. 4, Apr. 1977, pp. 176–186.

Kuroda et al., "Channeled-Substrate-Planar Structure Distributed-Feedback Semiconductor Laser," *Appl. Phys. Lett.*, vol. 33, No. 2, Jul. 1978, pp. 173–174.

Thompson et al., "Sagnac Fiber-Ring Interferometer Gyr. with ...," *Appl. Phys. Lett.*, vol. 33, No. 11, Dec. 1978, pp. 940–941.

*Primary Examiner*—John D. Lee
*Attorney, Agent, or Firm*—Nathan Edelberg; Robert P. Gibson; Saul Elbaum

[57] ABSTRACT

A double-heterojunction diode fabricated on a single crystal fiber which is voltage and acoustically controlled so as to alternately be caused to be a laser, an optical amplifier, or a detector of optical signals. A preferred embodiment utilizes gallium arsenide (GaAs) and gallium aluminum arsenide (GaAlAs). The double-heterojunction diode when electronically powered with the right polarity becomes an injection amplifier, with the addition of an acousto-optic grating of suitable period for feedback becomes a laser, and with a suitably reversed potential and different acoustic period becomes a heterodyne detector. In a preferred embodiment, the device is utilized to insert frequency controlled coherent optical or infrared signals in both directions in a fiber waveguide, amplify those signals, and detect the heterodyne difference frequency.

7 Claims, 3 Drawing Figures

LASER/AMPLIFIER/DETECTOR DIODE

RIGHTS OF THE GOVERNMENT

The invention described herein may be manufactured, used, and licensed by or for the U.S. Government for governmental purposes without the payment to me of any royalties thereon.

BACKGROUND OF THE INVENTION

1. Field of the Invention

The present invention is related to solid state optical devices and, more particularly, is directed toward injection diode amplifiers and lasers, acousto-optic feedback gratings, diode detectors, and single crystal fibers having cladding for operating as optical/infrared waveguides.

2. Description of the Prior Art

Double-heterojunction diode lasers, amplifiers and detectors have individually been under intensive development. For example, extensive research is being performed on constricted double-heterojunction single-mode lasers and detectors based upon use of gallium arsenide and gallium aluminum arsenide where the percentages of gallium and aluminum are varied. This work has resulted in excellent lasers including the Distributed Feedback Laser. See, for example, the article entitled "Channeled-Substrate-Planar Structure Distributed-Feedback Semiconductor Lasers" by Kuroda et al., *Applied Physics Letters*, 1978.

Extensive research is also being conducted on the growing of very long single crystal fibers having cross-sections of a few square micrometers. One of the materials which can be grown in single crystal fibers is gallium arsenide and, with the addition of a gallium aluminum arsenide cladding, these fibers become optical or infrared waveguides.

A third area of extensive research involves acousto-optic control of optical signals on integrated optics.

My prior U.S. Pat. Nos. 4,133,612 and 4,138,196 set forth a rotary motion sensor which employs an endless, closed-loop, multiple turn fiber interferometer which takes advantage of the Sagnac interferometer effect. Sagnac demonstrated that light traversing a closed path experiences an apparent path length change when the closed path is rotated about an axis perpendicular to the plane containing the closed path. He demonstrated that the apparent path length increased in the direction of rotation and decreased in the opposite direction.

In my improved embodiment set forth in U.S. Pat. No. 4,133,612, coherent laser radiation is coupled into the fiber interferometer in both a clockwise and counter-clockwise direction and is permitted to traverse the entire interferometer waveguide many times so as to increase the cumulative phase shift due to multiple traversals. Means are provided for coupling the coherent radiation into and out of the fiber interferometer.

With the advent of the above-described technologies, I have recognized that there exists means whereby the input and output coupling of the signals to and from the fiber interferometer can be improved, which would greatly increase the accuracy of the rotational rate sensing device. It is toward achieving this broad object that the present invention is advanced.

OBJECTS AND SUMMARY OF THE INVENTION

It is therefore a primary object of the present invention to provide an improved rotary motion measurement device and technique which greatly improves the accuracy of the prior art devices.

Another object of the present invention is to combine recent technologies in a unique manner for achieving a very sensitive and stable technique for measuring rotation.

A further and more specific object of the present invention is to provide a means for inserting coherent radiation in both directions in an optical/infrared fiber waveguide, means for offsetting the frequency of the radiation propagating in opposite directions by very specific frequencies, means for amplifying the two signals to offset the losses in signal intensity, and means for extracting the signals and detecting the different frequencies.

The foregoing and other objects are attained in accordance with one aspect of the present invention through the provision of apparatus which comprises a single crystal optical fiber waveguide, first means for inserting coherent infrared/optical signals having different frequencies into the waveguide in opposite directions, second means for amplifying the signals as they travel through the waveguide, and third means for deflecting the signals out of the waveguide and for detecting the heterodyne difference frequency of the deflected signals.

In accordance with more specific aspects of the present invention, the first, second, and third means comprises a double heterojunction diode having an active P-N region fabricated on the waveguide, and means for injecting an acoustic surface wave across the active region of the diode at a first wavelength for causing the diode to act as the first means and at a second wavelength for causing the diode to act as the third means. More particularly, the diode is positioned transversely to the direction of propagation of the signals to the waveguide, and includes electrode means for applying a D.C. potential across the active region of the diode. The D.C. potential applied to the electrode means is of one polarity when the diode acts as the first means and is of the opposite polarity when the diode acts as the third means. The means for generating an acoustic surface wave is inactive when the diode acts as the second means. The means for generating an acoustic surface wave more particularly comprises an acousto-optic transducer coupled to one of the P-N layers which comprise the active region of the diode.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENT

Figure 1:
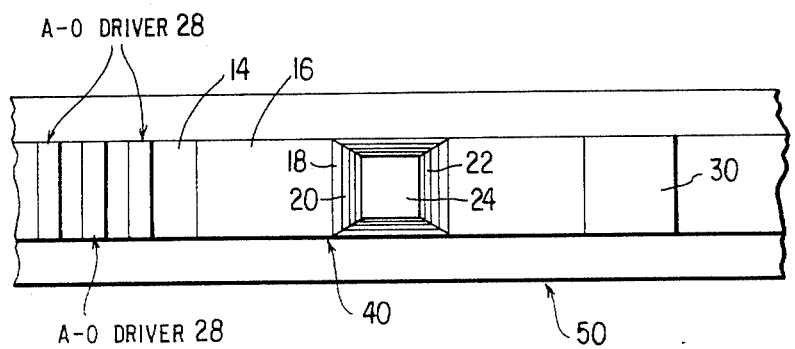
FIG. 1 is a top view illustrating a portion of the preferred embodiment of the present invention.
Figure 2:
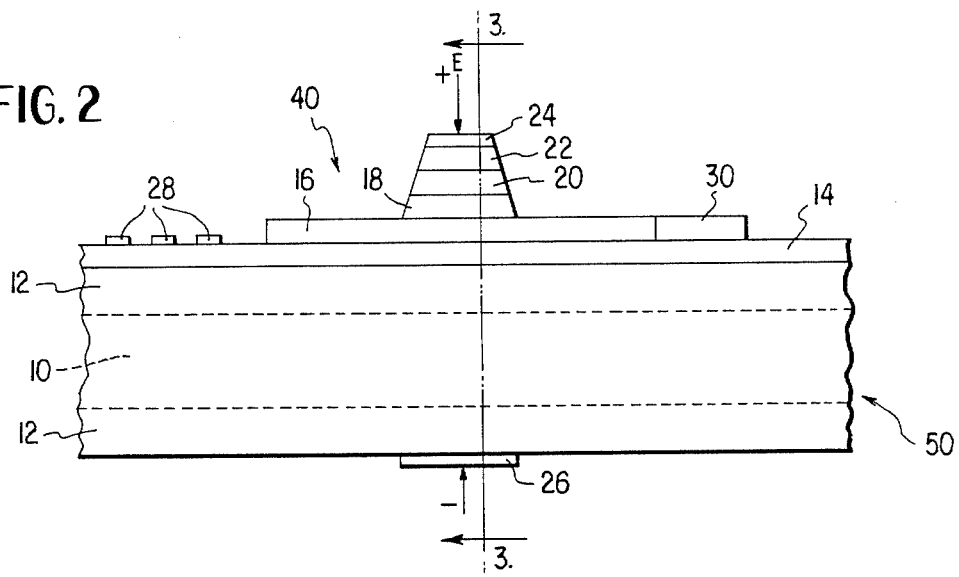
FIG. 2 is a side view of the preferred embodiment illustrated in FIG. 1.
Figure 3:
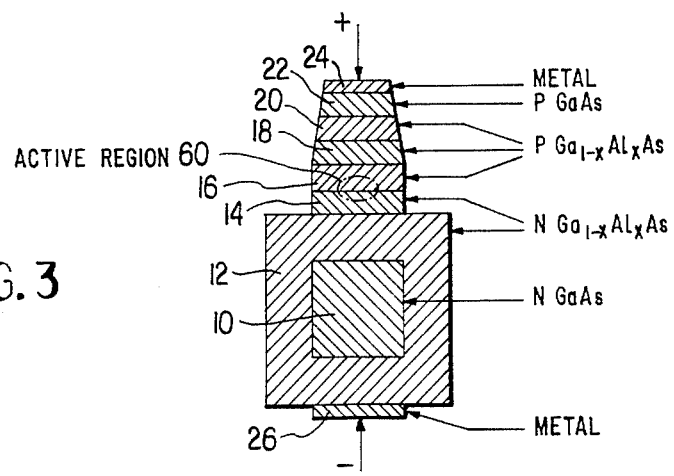
FIG. 3 is a cross-sectional view of the preferred embodiment illustrated in FIG. 2.

Referring now to the drawings, where like reference numerals represent identical or corresponding parts throughout the several views, and more particularly to FIGS. 1-3 thereof, there is illustrated a preferred embodiment of the device of the present invention which comprises a double-heterojunction diode 40 grown on a single crystal substrate 50. The diode 40 is biased and driven in different ways to operate alternately as a laser, amplifier and detector.

The preferred embodiment to be described hereinafter utilizes gallium arsenide (GaAs) and gallium aluminum arsenide (GaAlAs). It will be understood, however, by a person of ordinary skill in the art that other materials may be equal or superior in performance to GaAs and GaAlAs.

Initially, a GaAs single crystal fiber 10 is grown on one face only in accordance, for example, with the technology developed at Arthur D. Little, Inc. (see J. S. Haggerty, "Development of Single Crystal Ceramic Fibers," NASA CR 134605 ADL 75245). The process described in the foregoing work involved a special furnace and technique using a $CO_2$ laser. Although primarily involving sapphire, GaAs can be grown in a like manner.

For the GaAs single crystal fiber 10, growth is on a cubic face and a spooling process is required to roll the fiber on a drum or spool. The length of the fiber so constructed may be according to its desired use. For example, when utilized in an interferometric rotation sensing device or transducer, the length should be around 100 meters, although shorter lengths may be satisfactory.

A regrowth process is next required to deposit a layer 12 of GaAlAs on the outside of the single crystal fiber substrate 10. The index of refraction of cladding 12 is somewhat less than fiber 10 due to the aluminum content in layer 12. This causes optical signals to be guided or contained within the fiber 10.

Most semiconductor materials which can be made to lase are not very transparent without injecting electrons. A study of the wavelengths of transparency for GaAs indicate that GaAs and GaAlAs can be an efficient injection laser at wavelengths of 1.4 microns and longer. At these wavelengths, the GaAs fiber can be a good waveguide.

The diode 40 consists of several layers 14, 16, 18 and 20 of GaAlAs epitaxially grown on the waveguide 50. The layer 14 is N-doped, while the layers 16, 18 and 20 are P-doped. A layer of GaAs 22 is positioned adjacent the outermost layer of GaAlAs 20 while electrodes 24 and 26 are positioned across the layered structure 40 to provide input power and to receive the detector output.

The active region in diode 40 is indicated generally by reference numeral 60 in FIG. 3 and is located at the junction of layers 14 and 16.

It may be noted that a constricted double-heterojunction single mode laser and a constricted double-heterojunction detector are geometrically and materially basically the same. The laser requires a feedback technique not required by the detector, and the injection currents applied at electrodes 24 and 26 are opposite. A detector can be converted to a laser by reversing the current flow and adding feedback.

While reversing current flow is relatively simple, adding feedback is more complicated. For example, the acoustic propagation velocity in GaAs is approximately 2720 meters per second, and the velocity increases with the addition of aluminum for gallium. The provision of an acoustic transducer 28 in the form of interdigital metal strips onto one layer 14 in the active region allows the injection of an acoustic surface wave on level 14. The acoustic wave propagates along level 14 and through the active region 60 between layers 14 and 16. Since layer 14 has less aluminum than layers 16 or 12, the acoustic waves are guided primarily to level 14, but the pressure waves extend into layers 14 and 16. The acoustic waves are attenuated along layer 14 in both directions or, as shown in FIG. 2, an acoustic absorber 30 may be added. The acoustic wave generated by driver 28 causes reflection of the stimulated emissions, thereby making the diode 40 a distributed feedback injection laser. The location of the transducer 28 is such as to optimize the acoustic waves in the active region 60 of the diode 40.

The lasing P-N junction materials can both be GaAlAs, in accordance with the Kuroda et al. article mentioned hereinabove. The ratio of gallium to aluminum influences the frequency of the lasing. The active lasing region 60 is very close to the GaAs fiber 10 and the radiation evanescently couples into the fiber 10 and then propagates in the fiber, since the index of refraction in the fiber is higher than that in the active region of the injection laser. The published literature contains detailed descriptions of the theory of performance and construction of constricted double-heterojunction injection lasers and constricted double-heterojunction detectors, therefore inclusion of such detailed description is not necessary in understanding the principles and operation of the present invention.

As mentioned hereinabove, an injection laser diode and an injection amplifier diode are basically the same except that the amplifier does not have distributed feedback. The gain or active region may be in the GaAs fiber for better amplification, rather than in the evanescent region. It is important that layer 12 under the diode 40 be sufficiently thin so that part of the guided waves along fiber 10 reach into the active region 60. Further, layer 12 must be thick enough to support the guiding of the radiation in fiber 10, and under the diode 40 it must be thin enough to allow the guided wave to stimulate emission. Etching of layer 12 prior to deposition of the diode structure 40 can be utilized to optimize amplification and guidance. Performance of the device of the present invention may be more readily appreciated through the following example wherein it is utilized as a Sagnac fiber-ring interferometer gyro having closed ends. See, for example, the article by Thompson et al. entitled "Sagnac Fiber-Ring Interferometer Gyro With Electronic Phase Sensing Using A Gallium Aluminum Arsenide Laser," *Applied Physics Letters* 33 (11), Dec. 1, 1978, pages 940-941. Assume that the following conditions obtain:

1. Lasing Wavelength = $1.4\mu$;
2. Length of GaAs single crystal fiber = 100 meters;
3. The fiber is spooled on a core like a solenoid and the ends are grown together;
4. Acoustic velocity of propagation in GaAs is 2720 meters per second;
5. Index of refraction of GaAs = 3.5;
6. The GaAs single crystal fiber is grown on a cubic side;
7. Diameter of fiber solenoid = 10 centimeters;

8. The single crystal fiber operates as a single mode waveguide when $[2\pi a/\lambda][n^2_1-n^2_2]^{\frac{1}{2}}$ is less than 2.4, where a is half the width of the fiber, $\lambda$ is the freespace wavelength of radiation, $n_1$ is the index of refraction of the GaAs core and $n_2$ is the index of refraction of the GaAlAs cladding. Let $a=10^{-5}$ meters, $\lambda=1.4\times 10^{-6}$ meters, and $n_1=3.5$; then by letting the above equal 2.4 the index of refraction of the GaAlAs cladding should be 3.4923. Aluminum would replace gallium to bring the index to 3.4923.

9. Other ratios of gallium to aluminum are according to good design practice as described in the Kuroda et al. paper, supra.

With the potential E above threshold in the polarity shown in FIGS. 2 and 3, the diode 40 is an amplifier and optical signals going either direction in the waveguide 10 are amplified through stimulated mission.

With the potential E above threshold in the polarity shown in FIGS. 2 and 3 and with the addition of an acoustic wave from driver 28 of suitable amplitude and wavelength, where $\Lambda=3\lambda/2n$, the diode 40 becomes an injection laser ($\lambda$ is freespace wavelength of laser radiation and n is index of refraction). The acoustic wavelength $\Lambda=3\times 1.4\times 10^{-6}/2\times 3.5=0.6\times 10^{-6}$ meters. The acoustic transducer driving frequency $F_1$ is 2720 meters per sec/$0.6\times 10^{-6}$ meters $=4.533$ GHz. This frequency is high but still reasonable for acoustic transducers. The center lasing frequency $f_o$ of the device $3\times 10^8/1.4\times 10^{-6}$ or $2.1429\times 10^{14}$ Hz. Since the acoustic grating is in motion, the injection laser frequency propagating to the right in FIG. 2 is $f_o+4.533\times 10^9$ Hz. and the laser frequency propagating to the left is $f_o-4.533\times 10^9$ Hz.

Reversing the potential E turns the diode 40 into a detector. Setting the acoustic grating period to $2\lambda/n$ causes the optical signals to be deflected at 90° to the waveguide 10 into the active detector area. The grating period $\Lambda=2\lambda/n=2\times 1.4\times 10^{-6}/3.5=0.8\times 10^{-6}$ meters. The acoustic frequency Fd to deflect the optical signals is $2720/0.8\times 10^{-6}=3.4\times 10^9$ Hz. Since the grating is in motion, the optical signal from the right in FIG. 2 is increased by $3.4\times 10^9$ Hz and the left is decreased by $3.4\times 10^9$ Hz.

The device of the present invention has many diverse uses, and the example above is as the active element in an interferometer rotation sensor. The example uses a 100 meter waveguide. This waveguide can be wrapped in a solenoid fashion in a 10 cm diameter coil with the two ends carefully grown together so as to keep reflections at an insignificant level. In operation, the present invention is first put in its laser mode until the coherent radiation almost fills the waveguide. This takes $100\times 3.5/3\times 10^8=1.1667\times 10^{-6}$ seconds. The device is then switched to an optical amplifier by turning off the acoustic signal. The gain of the amplifier is set by control of potential E so that losses in the waveguide 10 are only slightly greater than the gain. This allows the laser signals to continue to propagate through the coiled waveguide at $f_0+F_1$ and $f_0-F_1$. $f_0+F_1$ would be propagating to the right as per FIG. 2 and $f_0-F_1$ to the left. After a predetermined time, the amplifier is switched to a detector by reversing the polarity of E and turning the acoustic signal on to Fd. The optical signal which is propagating to the right is gated out at $f_0+F_1-Fd$ and the signal propagating to the left is gated out at $f_0-F_1+Fd$. $f_0+F_1-Fd=f_0-1.133\times 10^9$ Hz and $f_0-F_1+Fd=f_o+1.133\times 10^9$ Hz. Both signals are present in the detector. This mode of operation is a Sagnac interferometer gyro and relative phase of the two signals gated into the detector is $4 A\Omega N/c\lambda_o$, where A is the cross sectional area of the solenoid is square meters, N is the number of turns, $\Omega$ is the rotation rate in radians per second about the axis of the solenoid, c is the speed of light in a vacuum in meters per second, and $\lambda$ is the freespace wavelength of the optical signals in meters. The area in the example is $\pi 5^2\times 10^{-4}=78.5\times 10^{-4}$ sq. meters. The circumference of one turn is $\pi 0.1=0.31416$ meters and the turns $N=318$. The phase shift is then $4\times\Omega\times 7.85\times 3.18\times 10^{-1}/3\times 10^8\times 1.4\times 10^{-6}=23.77\times 10^{-3}\Omega$ radians. This is the phase shift in radians between the counter propagating optical signals for a complete pass through the optical solenoid. Since the diode 40 in the amplifier mode allows many passes, the total phase shift is $0.02377\Omega$ radians times the number of passes. A million passes requires 1.1667 seconds and the phase shift would be $23.77\times 10^3\Omega$ radians. For the earth's rotation rate of 0.074 mr/s the phase shift is 1.76 radians.

The oscillators developing the acoustic transducer driving signals at 3.4 GHz or 4.533 GHz can be made very stable and their difference frequency of 1.133 GHz can be doubled to 2.266 GHz for a stable reference frequency. The $f_0-1.133\times 10^9$ Hz and $f_0+1.133\times 10^9$ Hz signals are heterodyned in the detector and the difference frequency of $2.266\times 10^9$ Hz extracted. This signal is phase detected with the reference signal. In some cases, it is advantageous to heterodyne the $2.266\times 10^9$ Hz signal and reference to a lower frequency such as 100 Mhz before phase detection.

Obviously, numerous modifications and variations of the present invention are possible in light of the above teachings. It is therefore to be understood that within the scope of the appended claims, the invention may be practiced otherwise than as specifically described herein.

I claim as my invention:

1. An apparatus, comprising:
    a single crystal optical fiber waveguide;
    a double heterojunction diode having an active P-N region fabricated on said waveguide;
    first means for causing said diode to function as a source of laser radiation and for causing said laser radiation to be coupled into said waveguide in opposite directions having a different frequency in each direction;
    second means for causing said diode to function as an amplifier of said radiation in said waveguide;
    third means for causing said diode to deflect said radiation out of said waveguide and for detecting the heterodyne difference frequency of said deflected radiation.

2. An apparatus, as recited in claim 1, wherein said first means for causing said diode to function as a source of laser radiation comprises means for injecting an acoustic surface wave across said active region of said diode at a first wavelength.

3. An apparatus, as recited in claim 2, wherein said third means for causing said diode to deflect said radiation out of said waveguide and for detecting the heterodyne difference frequency of said deflected radiation comprises means for causing said means for injecting an acoustic surface wave across said active region to inject an acoustic surface wave across said active region at a second wavelength.

4. The apparatus as set forth in claim 3, wherein said diode is positioned transversely to the direction of propagation of said radiation through said waveguide, and includes electrode means for applying a D.C. potential across said active region of said diode.

5. The apparatus as set forth in claim 4, wherein said D.C. potential applied to said electrode means is of one polarity when said diode acts as said first means and is of the opposite polarity when said diode acts as said third means.

6. The apparatus of claim 5, wherein said means for injecting an acoustic surface wave is inactive when said diode acts as said second means.

7. The apparatus of claim 3, wherein said means for injecting an acoustic surface wave comprises an acousto-optic transducer coupled to one of the P-N layers which comprise the active region of said diode.

* * * * *